United States Patent [19]

Lampman et al.

[11] Patent Number: 4,771,242

[45] Date of Patent: Sep. 13, 1988

[54] IN-VIVO SPATIALLY ENCODED MAGNETIC RESONANCE SPECTROSCOPY WITH SOLVENT SUPPRESSION

[75] Inventors: David A. Lampman, Cleveland; Gregory C. Hurst, Shaker Hts.; James M. McNally, Chagrin Falls, all of Ohio

[73] Assignee: Picker International, Inc., Highland Hts., Ohio

[21] Appl. No.: 834,318

[22] Filed: Feb. 27, 1986

[51] Int. Cl.[4] .......................................... G01R 33/20
[52] U.S. Cl. ................................................... 324/309
[58] Field of Search ............... 324/300, 307, 309, 310, 324/311, 312

[56] References Cited

U.S. PATENT DOCUMENTS

| | | | |
|---|---|---|---|
| 4,480,228 | 10/1984 | Bottomley | 324/309 |
| 4,506,223 | 3/1985 | Bottomley et al. | 324/309 |
| 4,558,277 | 12/1985 | Post et al. | 324/309 |
| 4,629,988 | 12/1986 | Bottomley et al. | 324/309 |
| 4,678,995 | 7/1987 | Avison et al. | 324/309 |

OTHER PUBLICATIONS

"Solvent Suppresion in Fourier Transform Nuclear Magnetic Resonance", vol. 55, J. Mag. Res., pp. 283-300 (1983), Hore.
"Volume Selective Excitation, A Novel Approach to Topical NMR", Aue et al., vol. 50, J. Mag. Res., pp. 350-354 (1984).
"NMR Chemical Shift Imaging in Three Dimensions", Brown et al., Proc. Nat. Acad. Sci., vol. 79, pp. 3523-3526 (1982).
"$^{31}$P Spectroscopic Zeugmatography of Phosphorus Metabolites", Bendel et al, vol. 38, J. Mag. Res., pp. 343-356 (1980).
"Spatially Resolved High Resolution Spectroscopy by Four Dimensional NMR", Maudsley et al., 51, J. Mag. Res. pp. 147-152 (1983).
"Towards Biochemical Imaging", Cox et al., vol. 40, J. Mag. Res., pp. 209-212 (1980).
"Depth-Resolved Surface-Coil Spectroscopy (Dress) for In-Vivo $^1$H, $^{31}$P, $^{13}$CNMR", Bottomley et al, 59, J. Mag. Res., pp. 338-342 (1982).

*Primary Examiner*—Stewart J. Levy
*Assistant Examiner*—Kevin D. O'Shea
*Attorney, Agent, or Firm*—Fay, Sharpe, Beall, Fagan, Minnich & McKee

[57] ABSTRACT

A binomial pulse generator (32) selectively generates binomial radio frequency excitation pulses (60) which induce magnetic resonance only in selected hydrogen dipoles and suppresses resonance in others. An inversion pulse generator (34) generates a first inversion pulse (70) in the presence of a first magnetic field gradient (72) generated by a gradient control (22). The inversion pulse only inverts the magnetization of resonating nuclei in a first plane defined by the first magnetic field gradient. A second inversion pulse (74) applied in the presence of a second magnetic field gradient (76) inverts the magnetization of resonating nuclei in a second planar region defined by the second magnetic field gradient. A third inversion pulse (78) applied concurrently with a third magnetic field gradient (80) inverts the magnetization of resonating nuclei in a third planar region defined by the third magnetic field gradient. Only resonating nuclei in a volumetric element defined at the intersection of the first, second, and third planes are inverted all three times. The magnetization of other dipoles will have dephased differently from the dipoles in the volumetric element. In this manner, only the dipoles in the volumetric element contribute to a spin echo (82) which follows the third inversion pulse. Data acquired during the third spin echo may be spectrographically analyzed to determine the chemical composition within the volumetric element. Alternately, a phase encoding gradient (90) and a read gradient (92) may be applied as part of the sequence to provide the appropriate phase encoding to the acquired data such that the acquired data can be reconstructed into an image representation.

20 Claims, 2 Drawing Sheets

IN-VIVO SPATIALLY ENCODED MAGNETIC RESONANCE SPECTROSCOPY WITH SOLVENT SUPPRESSION

BACKGROUND OF THE INVENTION

The present invention relates to the art of magnetic resonance spectroscopy. It finds particular application in conjunction with in-vivo examinations and will be described with particular reference thereto. However, it is to be appreciated that the invention may find further application in conjunction with the magnetic resonance spectroscopic examination of localized regions for imaging, chemical shift analysis, and the like.

In non-imaging magnetic resonance spectroscopy, samples in a test tube may be immersed or dissolved in a solvent, such as water, before undergoing analysis. When analysing a sample for chemical compositions containing hydrogen, magnetic resonance signals from a water solvent are often several magnitudes greater than the magnetic resonance signals from the composition of interest. Similarly, signals from solvents other than water often drown out the signals of interest.

One technique for separating the solvent signals from the signals attributable to the composition of interest includes the use of binomial magnetic resonance excitation pulses. As set forth in "Solvent Suppression in Fourier Transform Nuclear Magnetic Resonance," J. Mag. Res., Vol. 55, pages 283-300 (1983), P. J. Hore, the binomial pulses selectively excite nuclei within limited ranges of resonance frequencies relative to the main magnetic field. That is, the binomial pulses excite magnetic resonance in specific, limited frequency ranges and suppress magnetic resonance excitation in other resonance frequency ranges. In this manner, resonance can be selectively excited in the nuclei of interest while suppressing resonance signals from the solvent.

Heretofore, the use of binomial pulses has been limited to chemical shift spectroscopy. In magnetic resonance imaging, gradient pulses are commonly applied concurrently with the excitation pulses. The gradients across the main magnetic field cause nuclei to have different resonance frequencies at different spatial positions along the gradient. The application of a binomial excitation pulse concurrently with a magnetic field gradient would shift the excitation frquency bands spatially such that the range of excited frequencies is different at each spatial position. The spatial shift would undo the selective excitation of only specific chemical compositions to the exclusion of others.

Also, in the field of chemical shift spectroscopy, various techniques have been developed to localize the examined region, such as the technique illustrated in U.S. Pat. No. 4,480,228 issued Oct. 30, 1984 to P. A. Bottomley. In the Bottomley patent, a 90° magnetic resonance excitation pulse is applied in the presence of a positive z-axis gradient. A first 180° inversion pulse is applied in the presence of a y-axis magnetic field gradient which causes a first spin echo. Subsequent to the first spin echo, a second 180° inversion pulse is applied in the presence of an x-axis magnetic field gradient. The second 180° pulse refocuses only the magnetization of resonating nuclei at the intersection of the three gradient planes. In this manner, only nuclei at the intersection of the planes contribute to a second spin echo. Chemical shift data acquired during the second spin echo is descriptive only of the nuclei at the intersection.

The Bottomley selective spatial localization technique is not amenable to solvent suppression. The application of the necessary gradient magnetic field concurrent with the excitation pulse renders the Bottomley technique incompatible with the Hore technique.

The present invention provides a new and improved technique which provides both solvent suppression and spatial region localization which is suitable for both chemical shift and imaging examinations.

SUMMARY OF THE INVENTION

In accordance with a first aspect of the present invention, a method of localized magnetic resonance spectroscopy is provided. Resonance is selectively excited in nuclei of interest substantially without exciting nuclei of a solvent associated therewith. Continued coherent resonance of the excited nuclei is limited to nuclei in a preselected volume of interest. Resonance data is collected from resonating nuclei in the volume of interest. In this manner, the acquired resonance data is limited to nuclei of interest in the selected spatial volume. The acquired data may optionally be utilized for chemical shift spectroscopic analysis or imaging.

In accordance with another aspect of the present invention, a method of selectively limiting of magnetic resonance to a preselected volumetric region is provided. An excitation pulse is applied in the absence of magnetic field gradients to excite magnetic resonance. A first inversion pulse is applied concurrently with a first magnetic field gradient to rephase the magnetization of the excited nuclei which lie generally along a first planar region defined by the first gradient. In this manner, only the nuclei in the planar region are rephased and would contribute to a first spin echo. A second inversion pulse is applied concurrently with a second magnetic field gradient to rephase the nuclei generally along a linear region at the intersection of planar regions defined by the first and second gradients. In this manner, only the nuclei along the generally linear region are rephased and would contribute to a second spin echo. A third inversion pulse is applied concurrently with a third magnetic field gradient to rephase nuclei in a volumetric element at the intersection of generally planar regions defined by the three magnetic field gradients such that the resonating nuclei in the volumetric element are rephased and contribute to a third spin echo. In this manner, data acquired during the third spin echo is only from the nuclei in the volumetric element.

One advantage of the present invention is that it facilitates the observation of hydrogen spectra of low concentration species in the presence of high concentrations of water.

Another advantage of the present invention is that it facilitates the spectroscopic examination of selectable regions of humans and other living tissue.

Yet another advantage of the present invention is that it simplifies data acquisition and handling.

Still further advantages of the present invention will become apparent to those of ordinary skill in the art upon reading and understanding the following detailed description of the preferred embodiment.

BRIEF DESCRIPTION OF THE DRAWINGS

The present invention may be embodied in various steps and arrangements of steps and in various components and arrangements of components. The drawings are only for purposes of illustrating a preferred embodi

DETAILED DESCRIPTION OF THE PREFERRED EMBODIMENT

Figure 1:
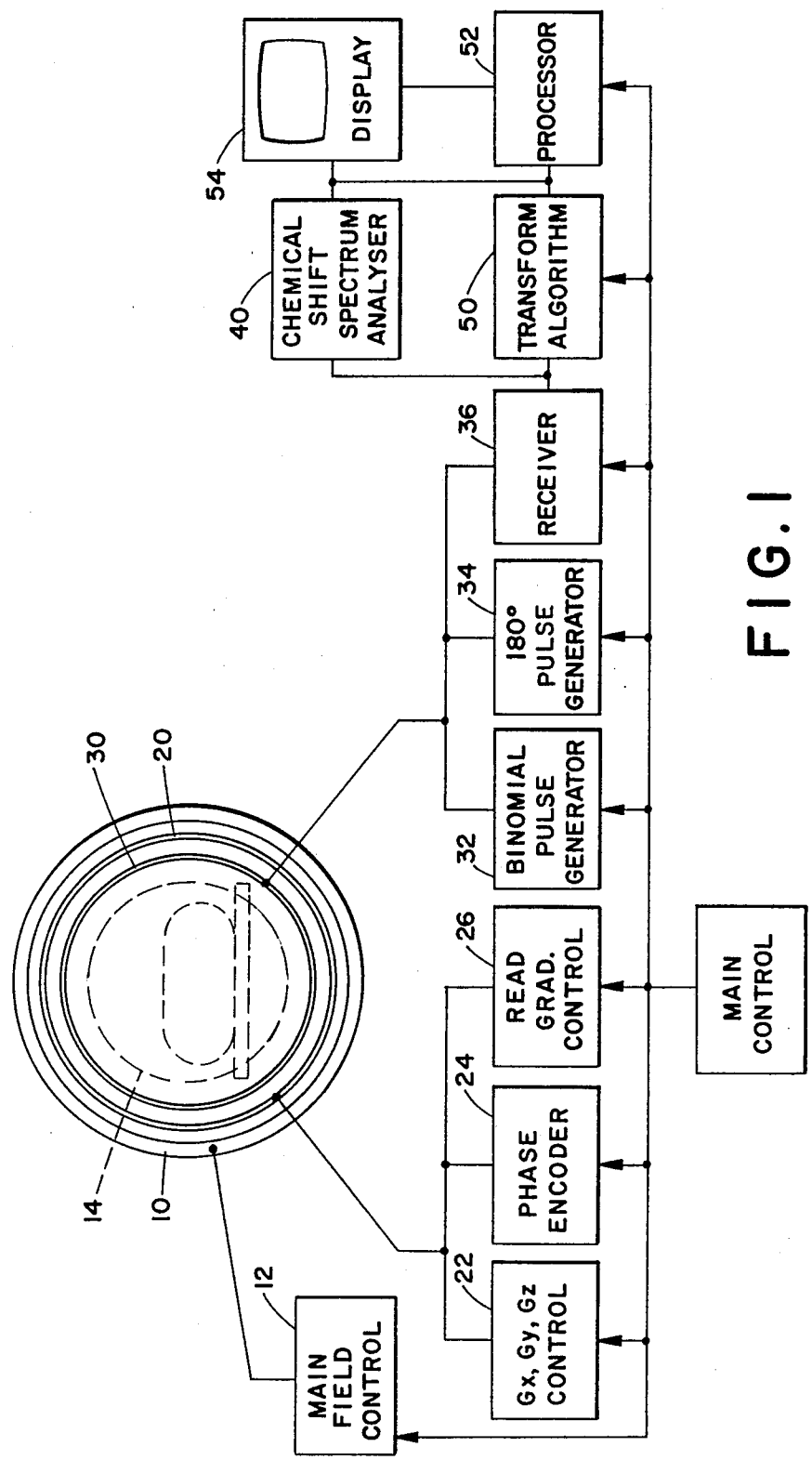
- FIG. 1 is a diagrammatic illustration of a magnetic resonance apparatus in accordance with the present invention.

With reference to FIG. 1, a magnetic resonance imaging apparatus includes a plurality of main field magnets 10 and a control circuit 12. The main magnetic field control circuit 12 controls the main field magnets such that a substantially uniform magnetic field is generated longitudinally through an image region 14. The uniform field causes a preferential alignment of the magnetization of nuclei in the image region. A gradient coil 20 includes the appropriate windings for causing gradients across the main magnetic field in the image region. A gradient control means or circuit 22 selectively applies electrical power to the gradient coil assembly to select the angle, duration, and periodicity with which magnetic field gradients are applied. In the preferred embodiment, the gradients are applied along a set of orthogonal axes, arbitrarily designated x, y, and z axis, where the z axis extends longitudinally along the main magnetic field. Each gradient field varies linearly across the image region 14 and defines a corresponding continuum of planar regions thereacross each with a common magnetic field strength. The strength of each magnetic field gradient pulse determines the rate of change or steepness of the gradient. A phase encoder means or control 24 selectively adjusts the applied gradients so as to cause a phase shift which varies with the spatial position for spatially encoding the resultant resonance signals along a selected one or more of the x, y, and z axes. A read gradient control 26 selectively applies a read gradient along the one or more of the axes.

A radio frequency (RF) coil 30 is connected with a binomial excitation pulse generator or control 32. The binomial pulse generator selectively causes the RF coil to transmit binomial excitation pulses in the absence of magnetic field gradients in accordance with the sequences and patterns set forth herein below.

The resonance frequency for a given nuclei is proportional to the product of its gyromagnetic ratio and the strength of the surrounding magnetic field. Each binomial excitation pulse includes bands of frequencies relative to the surrounding magnetic field strength which are excited and bands of frequencies which are not excited or suppressed. The strength of the surrounding main magnetic field generated by the main magnets 10 is selected relative to the binomial pulse frequency bands and the gyromagnetic ratio of nuclei in the image region such that resonance is excited in the nuclei of interest and suppressed in the nuclei of the solvent or other preselected nuclei.

An inversion pulse generator or control 34 selectively causes the RF coil to transmit 180° inversion pulses. The inversion frequency for a given nucleus is again proportional to the gyromagnetic ratio of the given nucleus and the surrounding magnetic field. Because the inversion pulses are applied in the presence of a magnetic field gradient, the surrounding magnetic field is the sum of the main and gradient magnetic fields. The 180° inversion pulses have a range or spectrum of frequencies which is selected to invert the magnetization of resonating nuclei only in a limited region, which limited region is determined by the magnetic field gradients generated by the gradient field control 22 and the RF coil 20. More specifically, each gradient varies the magnetic field strength linearly therealong, hence, varies the resonance frequency of the given nuclei linearly therealong. The inversion pulses invert resonating nuclei in a selected region along the gradient, i.e. a corresponding planar region transverse to the direction of the gradient. The position of the planar region along the gradient is determined by the frequencies of the inversion pulse relative to the amplitude of the gradient. The width or thickness of the planar region is determined by the breadth of the frequency spectrum and the strength or steepness of the magnetic field gradient. For simplicity of consistent operation in the preferred embodiment, the strength of the main magnetic field and the frequency spectrum of the inversion pulses are held constant. The steepness of the magnetic field gradient and the midpoint of the inversion pulse frequency spectrum are selectively varied.

A radio frequency receiver 36 receives radio frequency spin echo or other resonance signal components generated by the resonating nuclei in the image region. Separate transmit and receive coils may be provided or the RF coil 30 may function alternately as a transmitting and receiving antenna.

A chemical shift spectrum analysis means 40 analyzes received chemical shift spectrum spin echo data from the receiver to provide chemical composition and other spectrographic information. A transform means 50 transforms or maps discretely sampled values of phase encoded resonance signals received in the presence of a read gradient from a phase domain to a spatial domain. In the preferred embodiment, a fast, two-dimensional Fourier transform algorithm transforms or maps the received resonance signals from each selected spin echo to generate a corresponding view in the spatial domain.

A processor 52 processes the image views to create an electronic image representation of resonating nuclei. The image representation may be displayed on a video monitor 54 or other appropriate display. The processor 52 may perform other computer enhancement operations on the views or images. For example, the views or images may be color or gray scale encoded in accordance with the spectrographic data derived by the spectrographic analyzer 40. Alternately, the spectrographic data may be displayed directly on the video monitor or other appropriate display 54 along with any image representation. The spectrographic data, image representation, and any computer enhancements may be stored on disc or tape for later display, further processing, computer evaluation, electronic enhancement, or the like.

Figure 2:
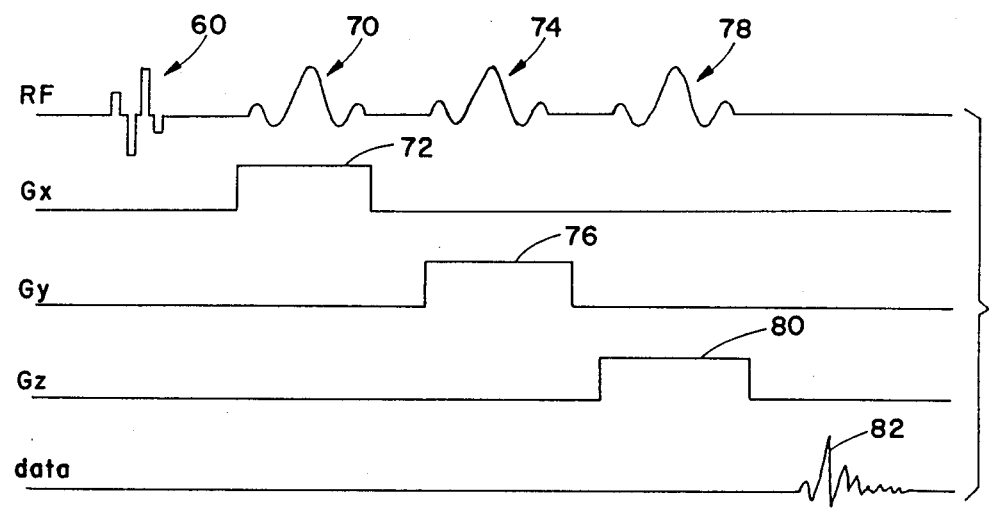
FIG. 2 is a diagrammatic illustration of a radio frequency and magnetic field gradient pulse sequence applied by the apparatus of FIG. 1 to implement chemical shift spectrum data acquistion aspects of the present invention; and, FIG. 3 is a diagrammatic illustration of excitation, inversion, and magnetic field gradient pulse sequence in conjunction with the present invention which is particularly adapted to in the collection of imaging data.

With reference to FIG. 2, the binomial pulse generator or resonance exciting means 32 selectively excites resonance in the nuclei of interest substantially without exciting nuclei of a solvent associated therewith. In the preferred embodiment, the resonance exciting means applies a binomial 90° excitation pulse 60, such as a 1$\bar{3}$3$\bar{1}$ pulse. The numerals of the pulse designation indicate the relative pulse lengths and the bars indicate a 180° phase shifted pulse. Equal delays separate each pulse of the sequence of pulses which are run together to provide the 1$\bar{3}$3$\bar{1}$ pulse. The binomial excitation pulse rotates the magnetization vectors of nuclei in a limited range or ranges of resonance frequencies by 90°. Nuclei which resonate at other frequencies are suppressed, i.e. not excited. The frequency at which any given nucleus resonates is dictated by the Larmor equation, i.e. is proportional to the product of the gyromagnetic ratio of the nuclei and the strength of the magnetic field in which it resides. Thus, by adjusting or appropriately selecting the strength of the main magnetic field generated by magnets 10 relative to the excitation and suppression bands of the binomial pulse, the nuclei which are to be excited and suppressed are selected. In the preferred embodiment, hydrogen nuclei in compositions other than water are excited and hydrogen nuclei in water are suppressed.

After resonance has been excited, the generation of magnetic resonance signals is limited to a selected volume of interest. Specifically, the inversion pulse generator 34 generates a first inversion pulse 70 concurrently with the gradient magnetic field control 22 generating a first gradient magnetic field gradient along a first direction or axis. The frequency spectrum of the first inversion pulse 70 and the first magnetic field gradient 72 cause the magnetization vectors of resonating nuclei located in a first planar region defined by the first magnetic field gradient to be inverted. Upon inversion, the dephasing magnetization vectors of the excited nuclei are flipped 180° and commence rephasing. Normally, the rephasing magnetizations would come completely back into phase creating a first spin echo. However, in the preferred embodiment the first spin echo data is not collected. Accordingly, it has been found advantageous to suppress or dephase the first spin echo to simplify data acquisition.

After a duration in which the first spin echo would have occurred had it not been dephased, the inversion pulse generator 34 causes the generation of a second inversion pulse 74 concurrently with the gradient control 22 causing a second magnetic field gradient 76. The second magnetic field gradient extends generally linearly through the image region to limit the inversion of nuclei by the frequency spectrum of the second inversion pulse to a second generally planar region defined thereby. Normally, a second spin echo would be caused by rephasing nuclei in a generally linear region at the intersection of the first and second planes. However, because the second spin echo does not contain data of interest in the preferred embodiment, the second spin echo is dephased or suppressed.

It is to be appreciated that the first inversion pulse 70 only inverted the magnetization vectors in the first planar region defined by the first magnetic field gradient 72. Magnetizations in other areas of the image region 14 continued to dephase. The second inversion pulse inverts the magnetizations in the second planar region defined by the second magnetic field gradient 76 to commence rephasing. The magnetizations in the second will refocus into a spin echo the same duration after the second inversion pulse as the duration between when they were last in phase and the second inversion pulse. The magnetizations lying in the second planar region which are not also lying in the first planar region have been dephasing since the excitation pulse 60. Those magnetizations which were first inverted by the first inversion pulse 70 and subsequently inverted by the second inversion pulse 74 will refocus the same duration after the second inversion pulse as the duration between when the first spin echo would have occurred and the second inversion pulse. The magnetization of the nuclei in the linear region in which the first and second planes intersect will thus refocus into a spin echo at a different time from the other nuclei in the image region and are readily segregated.

The volume of interest is further selected when the inversion pulse generator 34 applies a third inversion pulse 78 in the presence of a third magnetic field gradient 80. In this manner, the magnetization of only those dipoles are located both in the intersection of the first and second planes and a third plane defined by the third magnetic field gradient 80 are again inverted. The intersection of the first, second, and third planes thus defines a volumetric element or region which is the only region in which the magnetizations are sequentially inverted such that the magnetizations commence rephasing to form a third spin echo 82 when the magnetizations come into coincidence. The magnetization of vectors in other areas of the image region do not come into coincidence concurrently with the third spin echo 82 and, accordingly, do not contribute to the acquired data.

During the third spin echo 82, the receiver 86 acquires magnetic resonance data. The received magnetic resonance data is processed by the chemical spectrum analyzer 40 to determine the chemical compositions within the volumetric element. In the preferred embodiment, hydrogen bearing compositions are determined except water which is suppressed.

The strength of the gradients applied by the gradient control means 32 determines the thickness of the corresponding planar region. The steeper the gradient, the thinner the planar region. Thus, by adjusting the relative gradient strengths, the size and dimensions of the volumetric element can be selected and adjusted. It is to be appreciated that adjusting the strength of the gradients adjusts the total strength of the magnetic field in the image region, hence, the resonance frequency of the dipoles of interest. To compensate for this resonance frequency shift, the midpoints of the frequency spectrum of the first, second, and third inversion pulses are adjusted accordingly. Alternately, the dimensions of the volumetric element can be adjusted by adjusting the frequency spectrum or band width of the inversion pulses.

Adjusting the frequency of an inversion pulse adjusts the spatial position of the corresponding plane along the gradient axis. That is, by increasing or decreasing the midpoint frequency of the inversion pulse, the planar region along the gradient axis in which magnetizations are inverted is shifted to areas of stronger or weaker magnetic field strength. By appropriately selecting or adjusting the midpoint frequencies of each of the first, second, and third inversion pulses, the position of the volumetric element can be selected in three dimensions.

It is often convenient to provide an image representation of the nuclei in the selected volumetric element. In the preferred embodiment, the images are projections of the resonating dipoles in the volumetric element relative to one or more of the gradient axes.

Figure 3:
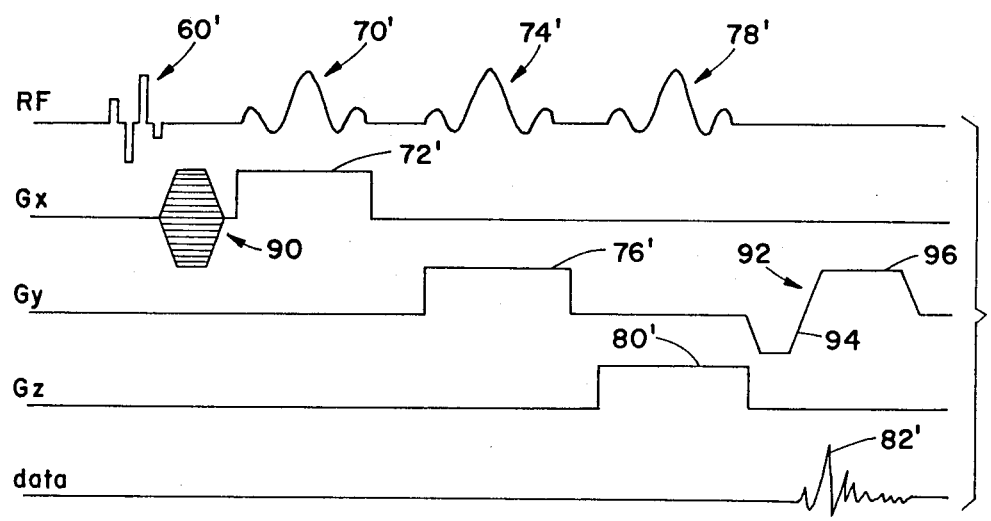

With reference to FIG. 3, the image of the volumetric element may be made before collection of the chemical spectrum data, after collection of the chemical spectrum data, or in the midst of collecting chemical data. To collect image data, the excitation pulse generator 32 causes the generation of a like binomial pulse 60' in the absence of gradient magnetic fields. This causes the same dipoles to be excited and suppressed as in the chemical shift experiment.

Following the excitation pulse, the phase encoding means 24 provides a selected one of a plurality of phase encoding pulses 90 along one or more of the axis. Thereafter, a first inversion pulse 70' is applied concurrently with a first magnetic field gradient 72'. The first spin echo, which would normally be generated by nuclei in the first planar region, is again dephased or suppressed. A second inversion pulse 74' and a second magnetic field gradient 76' are concurrently applied. The second spin echo, which would normally be generated by nuclei at the intersection of the first and second planes, is again dephased or suppressed. A third inversion pulse 78' is applied concurrently with a third magnetic field gradient 80' to cause a third spin echo 82'. A read gradient pulse sequence 92 is applied along a selected read direction. The read gradient sequence is selected such that a first portion 94 of the read gradient sequence is applied before the third spin echo 82' and a second portion 96 of the sequence is applied during the third spin echo. In this manner, the data acquired by the receiver 36 during the third spin echo represents a projection of the resonating nuclei in the volumetric element projected into the plane which is defined by the axes along which the phase encode and read gradient pulses are applied, in the illustrated sequence the x,y plane. By appropriately placing the phase encode and read gradients along others of the axis, projections into the x,z and y,z planes may also be produced. The data collected during the third spin echo is transformed by a two-dimensional Fourier transform means 50 into the image representation for display on the video monitor 54. By using like excitation, inversion, and gradient pulses in both the chemical shift and the imaging sequence, the image will be of the same region as the chemical shift data.

The invention has been described with reference to the preferred embodiment. Obviously, modifications and alterations will occur to others upon reading and understanding the preceding specification. It is intended that the invention be construed as including all such alterations and modifications insofar as they come within the scope of the appended claims or the equivalents thereof.

Having thus described the preferred embodiment, the invention is now claimed to be:

1. A method of localized magnetic resonance spectroscopy comprising:
    (a) applying a binomial 90° excitation pulse in the absence of magnetic field gradients to limit excitation of resonance to first selected nuclei without excitation of second selected nuclei;
    (b) applying fields to manipulate the nuclei such that only nuclei within a selected volumetric element contribute to a magnetic resonance signal;
    (c) acquiring the magnetic resonance signal from only the selected volumetric element; and,
    (d) repeating steps (a) through (c) for each of a plurality of volumetric elements of a region of interest.

2. The method as set forth in claim 1 further including generating an image representive of resonating nuclei in the volume of interest.

3. A method of localized magnetic resonance spectroscopy comprising:
    exciting magnetic resonance in first selected nuclei without exciting resonance in second selected nuclei;
    manipulating magnetization vectors of the resonating nuclei such that only resonating first selected nuclei in a selected volumetric element within a region of interest contribute to a sampled magnetic resonance signal; and,
    sampling the magnetic resonance signal.

4. The method as set forth in claim 3 wherein the selective excitation step includes applying a binomial 90° excitation pulse.

5. The method as set forth in claim 4 wherein the selective excitation step further includes coordinating the binomial excitation pulse with the strength of a main magnetic field such that the nuclei of interest are excited and hydrogen nuclei bonded in water are suppressed.

6. A method of localized magnetic resonance spectroscopy comprising:
    selectively exciting mgnetic resonance in nuclei of interest substantially without exciting nuclei of a solvent associated therewith;
    applying a first inversion pulse concurrently with a first magnetic field gradient to rephase the resonating nuclei in a first planar region such that the rephased nuclei tend to refocus towards a first spin echo;
    applying a second inversion pulse concurrently with a second magnetic field gradient to rephase the resonating nuclei in a second planar region, the first and second gradients being such that the first and second planar regions intersect in a generally linear region, such that only the nuclei in the linear region that were rephased by both the first and second inversion pulses nuclei tend to refocus toward a second spin echo;
    applying a third inversion pulse concurrently with a third magnetic field gradient to rephase the resonating nuclei in a third planar region, the third gradient being oriented such that the third planar region intersects the first and second planar regions in the volumetric element, such that only the nuclei in the volumetric element that were rephased by all three of the first, second, and third inversion pulses refocus to generate a third spin echo; and,
    acquiring resonance data from the volumetric element during the third spin echo.

7. The method as set forth in claim 6 further including adjusting the strength of at least one of the gradients to select a corresponding dimension of the volumetric element.

8. The method as set forth in claim 7 further including adjusting a frequency of at least one of the inversion pulses to adjust the spatial position of the volumetric element.

9. A method of localized magnetic resonance spectroscopy comprising:
    selectively exciting magnetic resonance in nuclei of interest substantially without exciting nuclei of a solvent associated therewith;
    limiting continued coherent magnetic resonance to the nuclei in a preselected volumetric element of interest;
    repeating the step of selectively exciting the nuclei of interest;
    phase encoding the excited nuclei;

repeating the step of limiting continued coherent magnetic resonance to the preselected volumetric element;

concurrently applying a read gradient and acquiring resonance data from the preselected volumetric element; and, reconstructing an image representation from the acquired data.

10. A method of localized magnetic resonance spectroscopy comprising:

selectively exciting magnetic resonance in nuclei of interest substantially without exciting nuclei of a solvent associated therewith;

phase encoding the excited nuclei;

limiting continued coherent magnetic resonance to the nuclei in a preselected volumetric element of interest;

acquiring resonance data from the volumetric element of interest;

during the data acquisition step, applying a read gradient; and, reconstructing an image representation from the acquired data.

11. A method of localized magnetic resonance spectroscopy and imaging, the method comprising:

generating a generally uniform main magnetic field;

phase encoding the resonating nuclei;

applying a first binomial 90° radio frequency excitation pulse to excite magnetic resonance of selected nuclei;

applying a first inversion pulse concurrently with a first magnetic field gradient;

applying a second inversion pulse concurrently with a second magnetic field gradient;

applying a third inversion pulse concurrently with a third magnetic field gradient;

acquiring data during a spin echo which follows the third inversion pulse while applying a read gradient;

reconstructing an image representation from the acquired data;

applying another binomial 90° excitation pulse;

applying another first inversion pulse concurrently with a repeated application of the first magnetic field gradient;

applying another second inversion pulse concurrently with a re-application of the second magnetic field gradient;

applying another third inversion pulse concurrently with further application of the third magnetic field gradient;

acquiring data during another spin echo which follows the third inversion pulse; and, spectroscopically analyzing the acquired data.

12. A method of localizing magnetic resonance comprising:

generating a generally main magnetic field;

applying a binomial excitation pulse in the absence of magnetic field gradients;

applying a first inversion pulse concurrently with a first magnetic field gradient to rephase the magnetization of resonating nuclei in a first planar region;

applying a second inversion pulse concurrently with a second magnetic field gradient to invert the magnetization of resonating nuclei in a second planar region, the magnetizations of nuclei in the intersection of the first and second planar regions rephase uniquely relative to other nuclei;

applying a third inversion pulse concurrently with a third magnetic field gradient to invert the magnetization of resonating nuclei in a third planar region, the magnetizations of nuclei in a volumetric element defined by the intersection of the first, second, and third planes being caused to rephase uniquely from other resonating nuclei and cause a spin echo; and, acquiring data during the spin echo.

13. The method as set forth in claim 12 further including the steps of:

applying a phase encoding gradient before the first inversion pulse, applying a read gradient during the data acquisition step, and reconstructing an image representation from the acquired data.

14. The method as set forth in claim 12 wherein the binomial excitation pulse selectively excites magnetic resonance in hydrogen dipoles other than water and suppresses magnetic resonance in hydrogen dipoles of water such that the acquired data is representative of the selected hydrogen dipoles exclusive of water.

15. The method as set forth in claim 14 further including the step of spectrographically analyzing the acquired data to ascertain the composition of hydrogen containing compositions in the volumetric element.

16. The method as set forth in claim 12 further including the step of selecting dimensions of the volumetric element by selecting amplitudes of the first, second, and third magnetic field gradients.

17. The method as set forth in claim 12 further including the step of selecting a position of the volumetric element by selecting frequencies of the first, second, and third inversion pulses.

18. An apparatus for localized magnetic resonance spectroscopy, the apparatus comprising:

a main magnetic field means for generating a generally uniform main magnetic field;

a resonance excitation means for selectively exciting magnetic resonance in selected nuclei of interest in the main magnetic field substantially without exciting nuclei of a solvent within the main magnetic field;

an inversion pulse generating means for generating inversion pulses and a gradient pulse generating means for generating magnetic field gradients across the main magnetic field concurrently with the inversion pulses so as to manipulate resonating nuclei such that only nuclei of a selected volumetric element contribute to a spin echo; and, a receiver for acquiring data during the spin echo.

19. An apparatus for localized magnetic resonance spectroscopy, the apparatus comprising:

a main magnetic field means for generating a generally uniform main magnetic field;

a binomial excitation pulse applying means for selectively applying binomial 90° radio frequency excitation pulses;

a gradient magnetic field control means for selectively applying magnetic field gradients along at least first, second, and third axis;

an inversion pulse generating means for selectively generating first, second, and third inversion pulses concurrently with application of the magnetic gradient fields along the first, second, and third axes, respectively; and, a receiving means for acquiring magnetic resonance data during a spin echo subsequent to the third inversion pulse.

20. A method for localized magnetic resonance spectroscopy comprising:
generating a generally uniform main magnetic field;
selectively exciting magnetic resonance in selected nuclei of interest in the main magnetic field substantially without exciting nuclei of a solvent within the main magnetic field;
manipulating the resonating nuclei such that only nuclei within a selected one of a plurality of volumetric elements contribute to a magnetic resonance signal by concurrently applying magnetization manipulating RF pulses and causing slice selecting magnetic field gradients across the main magnetic field; and,
acquiring magnetic resonance data only from the resonating nuclei in the selected volumetric element.

* * * * *